United States Patent [19]

Edelstein et al.

[11] Patent Number: 4,471,306

[45] Date of Patent: Sep. 11, 1984

[54] **METHOD OF NMR IMAGING WHICH OVERCOMES $T_2^*$ EFFECTS IN AN INHOMOGENEOUS STATIC MAGNETIC FIELD**

[75] Inventors: William A. Edelstein, Schenectady; Paul A. Bottomley, Clifton Park, both of N.Y.

[73] Assignee: General Electric Company, Schenectady, N.Y.

[21] Appl. No.: 345,444

[22] Filed: Feb. 3, 1982

[51] Int. Cl.³ .................................. G01R 33/08
[52] U.S. Cl. ..................................... 324/309; 324/311
[58] Field of Search ............................. 324/309, 311

[56] References Cited

U.S. PATENT DOCUMENTS

| | | | |
|---|---|---|---|
| 4,284,948 | 8/1981 | Young | 324/309 |
| 4,315,216 | 2/1982 | Clow et al. | 324/309 |
| 4,318,043 | 3/1983 | Crooks et al. | 324/309 |
| 4,339,716 | 7/1982 | Young | 324/309 |
| 4,431,968 | 2/1984 | Edelstein et al. | 324/311 |

FOREIGN PATENT DOCUMENTS 1596160 8/1981 United Kingdom .

OTHER PUBLICATIONS

Instrumentation for NMR Spin-Warp Imaging, by A. Johnson, T. M. S. Hutchinson, and L. M. Eastwood, in *Journal of Physics E:* Scientific Instruments, (Jan.), 1982.
A Whole-Body NMR Imaging Machine, by J. M. S. Hutchinson, W. A. Edelstein and G. Johnson, *Journal of Physics E:* Scientific Instruments, (Sep.), 1980.
Fast Scan Proton Density Imaging by NMR, by P. Mansfield, A. A. Mardsky and T. Baines, *Journal of Physics E:* Scientific Instruments, 1976.

Primary Examiner—Michael J. Tokar
Assistant Examiner—B. J. Kelley
Attorney, Agent, or Firm—Lawrence D. Cutter; James C. Davis, Jr.; Marvin Snyder

[57] ABSTRACT

The $T_2^*$ effects due to inherent inhomogeneities in the static magnetic field are overcome by the use of a 180° RF pulse to produce a nuclear spin echo suitable for obtaining spatial information and by the adjustment of the pulsed gradients such that the occurrence of the spin echo due to the applied gradients coincides with the occurrence of the nuclear spin echo derived from the rephasing of spins in the presence of the inhomogeneities inherent in the main static magnetic field. The 180° RF pulse is applied with the imaging gradients turned off so that long RF pulse lengths can be used, thus reducing RF power requirements. Exemplary applications of the pulse method to multiple angle projection reconstruction and two-dimensional Fourier transform (spin warp imaging) imaging techniques are also described.

35 Claims, 16 Drawing Figures

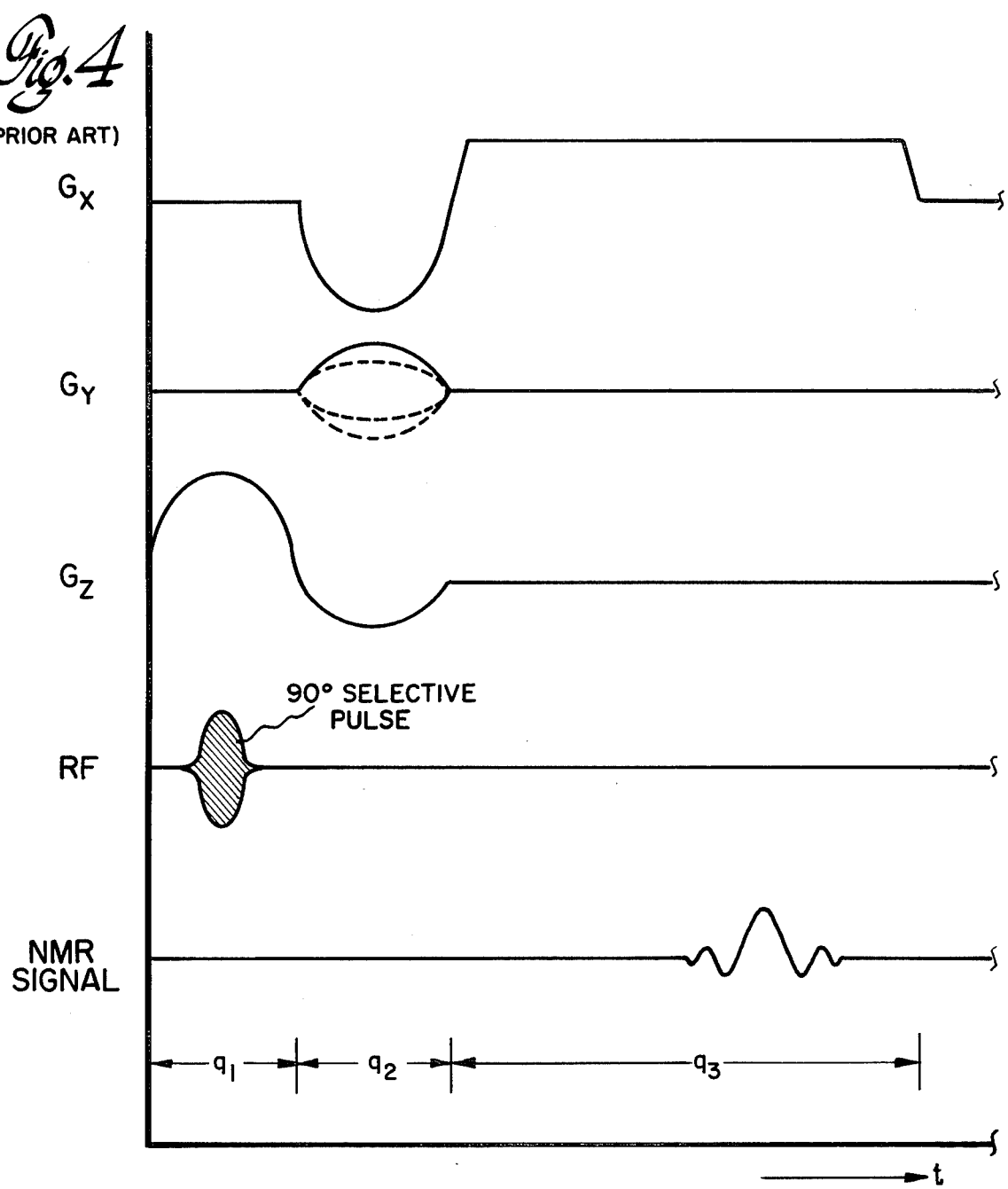
Fig.4 (PRIOR ART)
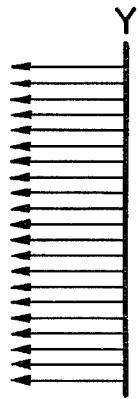
Fig.5a
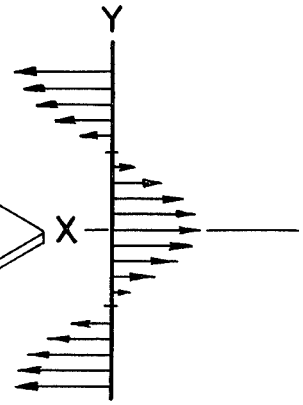
Fig.5b PHASE ENCODING GRADIENT

METHOD OF NMR IMAGING WHICH OVERCOMES T$_2$* EFFECTS IN AN INHOMOGENEOUS STATIC MAGNETIC FIELD

BACKGROUND OF THE INVENTION

This invention relates to nuclear magnetic resonance (NMR) imaging methods. More specifically, the invention relates to improved NMR imaging methods which overcome undesirable effects of inherent static magnetic field inhomogeneity and minimize radio frequency (RF) power requirements.

The nuclear magnetic resonance phenomenon occurs in atomic nuclei having an odd number of protons and/or neutrons. Each such nucleus has a net magnetic moment such that when placed in a static homogeneous magnetic field, $B_o$, a greater number of nuclei align with the $B_o$ field to create a net magnetization, M, in the direction of the field. Net magnetization M is the summation of the individul nuclear magnetic moments. Because a nuclear magnetic moment is the result of a nuclear spin, the terms "nuclear moment" and "nuclear spin" as used herein are synonymous.

Under the influence of the magnetic field $B_o$, the nuclei (and hence the net magnetization M) precess or rotate about the axis of the field. The rate (frequency) at which the nuclei precess is dependent on the strength of the applied magnetic field and on the nuclei characteristics. The angular frequency of precession, $\omega$, is defined as the Larmor frequency and is given by the equation $$\omega = \gamma B_o \qquad (1)$$

in which $\gamma$ is the gyromagnetic ratio (constant for each type of nucleus) and $B_o$ is the strength of the applied static homogeneous magnetic field. The frequency at which the nuclei precess is thus primarily dependent on the strength of the magnetic field $B_o$, and increased with increasing field strength.

A precessing nucleus is capable of absorbing electromagnetic energy. The frequency of the electromagnetic energy needed to induce resonance is the same as the precession frequency $\omega$. During the application of the electromagnetic energy, typically a radio frequency pulse, the net magnetization M precesses further and further away from the z-axis (arbitrarily assumed to be the direction of the $B_o$ field), depending on the energy and duration of the RF pulse. A 90° RF pulse causes the magnetization M to depart 90° from the direction of the $B_o$ field into the x-y plane defined by the x- and y-axis, for example, of the Cartesian coordinate system. Similarly, a 180° RF pulse causes the magnetization M to reverse direction by 180° from its original direction (from the positive z-axis direction to negative z-axis direction, for example). Following the excitation of the nuclei with RF energy, the absorbed energy is re-radiated as an NMR signal as the nuclei return to equilibrium. The energy is emitted as radio waves and also transferred to surrounding molecules.

It is possible to distinguish NMR signals arising from different spatial positions in the sample based on their respective resonant frequencies. If one or more magnetic field gradients of sufficient strength to spread out the NMR signal spectrum are applied to the sample, each nuclear spin along the direction of the gradient experiences different magnetic field strength and hence resonates at a frequency different from that of other nuclear spins, as predicted by equation (1). Spatial positions of the NMR signals are determined by Fourier analysis and knowledge of the configuration of the applied magnetic field gradient.

The return of the nuclear spins to equilibrium following RF excitation is referred to as "relaxation". The relaxation process is characterized by two time constants, $T_1$ and $T_2$, both of which are measures of molecular level motion. The spatial distribution of $T_1$ and $T_2$ throughout the sample provides useful imaging parameters in addition to the density of nuclear moments or spins.

$T_1$ is referred to as the "longitudinal" or "spin-lattice" NMR relaxation time and is a measure of the return of magnetization to equilibrium; i.e., the tendency of the nuclear spins to realign with the field $B_o$ after cessation of RF excitation. The rate of return to equilibrium is dependent on how fast energy can be transferred to surrounding material (lattice). $T_1$ can vary from a few milliseconds in liquids to minutes or hours in solids. In biological tissue, the typical range is from about 30 milliseconds to 3 seconds.

$T_2$, the transverse relaxation time or "spin-spin" relaxation time, is a measure of how long excited nuclear spins oscillate in phase. After a RF pulse, the nuclear spins are in phase and precess together. Each nuclear spin behaves like a magnet which generates a magnetic field that affects other spinning nuclei in its vicinity (spin-spin interaction). As each nuclear moment thus experiences slightly different magnetic fields, it precesses at a different rate and dephases with respect to the other spins, reducing the observed NMR signal. $T_2$ can vary from a few microseconds in solids to seconds in liquids and is always less than or equal to $T_1$. In biological tissue the range is about 5 milliseconds to 3 seconds.

If the static magnetic field $B_o$ itself has inherent inhomogeneities (as is often the case in practical magnets), these produce additional dephasing which hasten the decay of the NMR signal. This is because nuclear spins in different spatial positions are exposed to slightly different magnetic field values and hence resonate at slightly different frequencies. This new relaxation time, which includes the effects of magnet inhomogeneities, is designated $T_2$* ($T_2$ star), where $T_2^* \leq T_2$.

Free induction decay (FID) and the spin-echo are among the methods by which the NMR signal may be observed.

In FID, the nuclear spins are irradiated with a RF pulse (90°, for example). Upon termination of the RF pulse, the spins produce an RF magnetic field as they precess. The NMR signal is observable as long as the nuclear spins precess in phase. The signal decays as the spins dephase and the decay curve is called the FID. If the $B_o$ static magnetic field is perfectly homogeneous, the decay curve is exponential with time constant $T_2$. Otherwise, the decay is measured by $T_2$* which is apparatus dependent and not representative of the true $T_2$ relaxation time of the sample. Under these circumstances, FID is not an acceptable method of measuring $T_2$.

In the spin-echo method the nuclear spins are first subjected to a 90° RF pulse, as in FID, and then to a 180° RF pulse which creates the spin echo. Following the 90° RF pulse, the nuclear spins precess in phase but quickly get out of phase due to inhomogeneities in the static magnetic field $B_o$, as in FID. This loss of coherence can be reversed by the application of a 180° RF pulse which reverses in the direction of diverging spins and results in a "spin echo". The initial curve of the spin echo signal is a mirror image of the original FID signal as the nuclear spins regain coherence. The second portion of the curve duplicates the original FID signal. The spin echo has a lower intensity due to irreversible losses attributable to the $T_2$ relaxation process. The decay in the height of a series of such echoes can be used to calculate the $T_2$.

The NMR imaging pulse sequences in accordance with the present invention overcome the $T_2^*$ effects caused by the inhomogeneities of the static magnetic field used in NMR imaging systems. Also, because the imaging gradients are turned off during the RF pulse, long RF pulse lengths can be used, thus reducing RF power requirements.

SUMMARY OF THE INVENTION

The present invention relates to a method for NMR image formation which overcomes the effects of inherent static magnetic field inhomogeneity on spin echo formation. A static magnetic field is maintained along a first axis of a sample to be imaged. Nuclear spins within a predetermined region of the sample are excited by irradiation with a frequency selective RF pulse. Then, for a first predetermined time interval, at least one dephasing magnetic field gradient is applied along a second axis of the sample to dephase the excited nuclear spins. The dephasing of the nuclear spins by the magnetic field gradient is additional to the dephasing due to inherent inhomogeneities in the static magnetic field. After a predetermined elapsed time interval $\tau_a$ subsequent to the application of the frequency selective RF pulse, during a second time interval, the sample is irradiated with a 180° RF pulse so as to initiate the rephasing of the nuclear spins. During a third predetermined time interval, subsequent to the second time interval, at least one rephasing gradient having the same direction as the dephasing gradient is applied such that, at an interval of time equal to said interval $\tau_a$ following the 180° RF pulse, the nuclear spin echo caused by the rephasing of nuclear spins dephased by the dephasing gradient coincides with the occurrence of the nuclear spin echo derived from the rephasing of the nuclear spins dephased by the inherent inhomogeneities in the static magnetic field. The coinciding nuclear spin echoes produce a single composite NMR signal which is then collected.

It is an object of the invention to provide an NMR imaging pulse sequence which overcomes $T_2^*$ effects in an inhomogeneous static magnetic field.

It is another object of the invention to provide specific application of the predetermined planar pulse sequences to planar imaging methods such as two-dimensional Fourier transform (spin warp) imaging and multiple angle projection imaging.

It is a further object of the invention to use pulsed magnetic field gradients to reduce RF power requirements for the echo-producing 180° RF pulse.

It is still another object of the invention to provide NMR pulse sequences suitable for obtaining NMR imaging information of the spatial distribution of $T_1$ and $T_2$ throughout the sample.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 4 depicts another conventional NMR pulse sequence used in the spin warp imaging method.

FIG. 5a schematically illustrates a column of spins aligned in the y direction in the planar volume depicted in FIG. 1.

FIG. 5b schematically illustrates the phase changes resulting from the application of the phase encoding gradient.

DETAILED DESCRIPTION OF THE INVENTION

Figure 2:
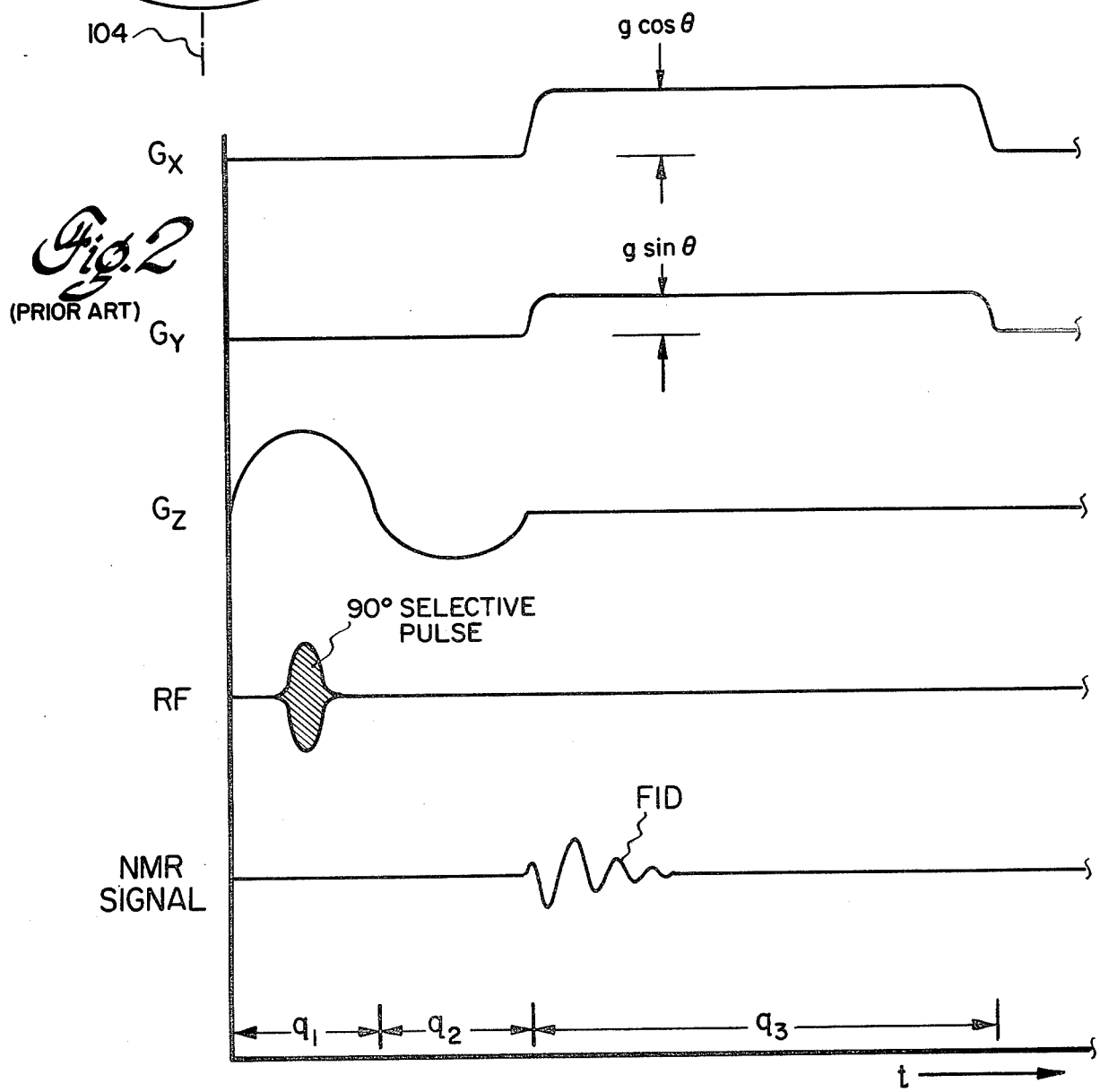
FIG. 2 depicts a conventional NMR pulse sequence used in the multiple angle projection reconstruction imaging method.
Figure 3:
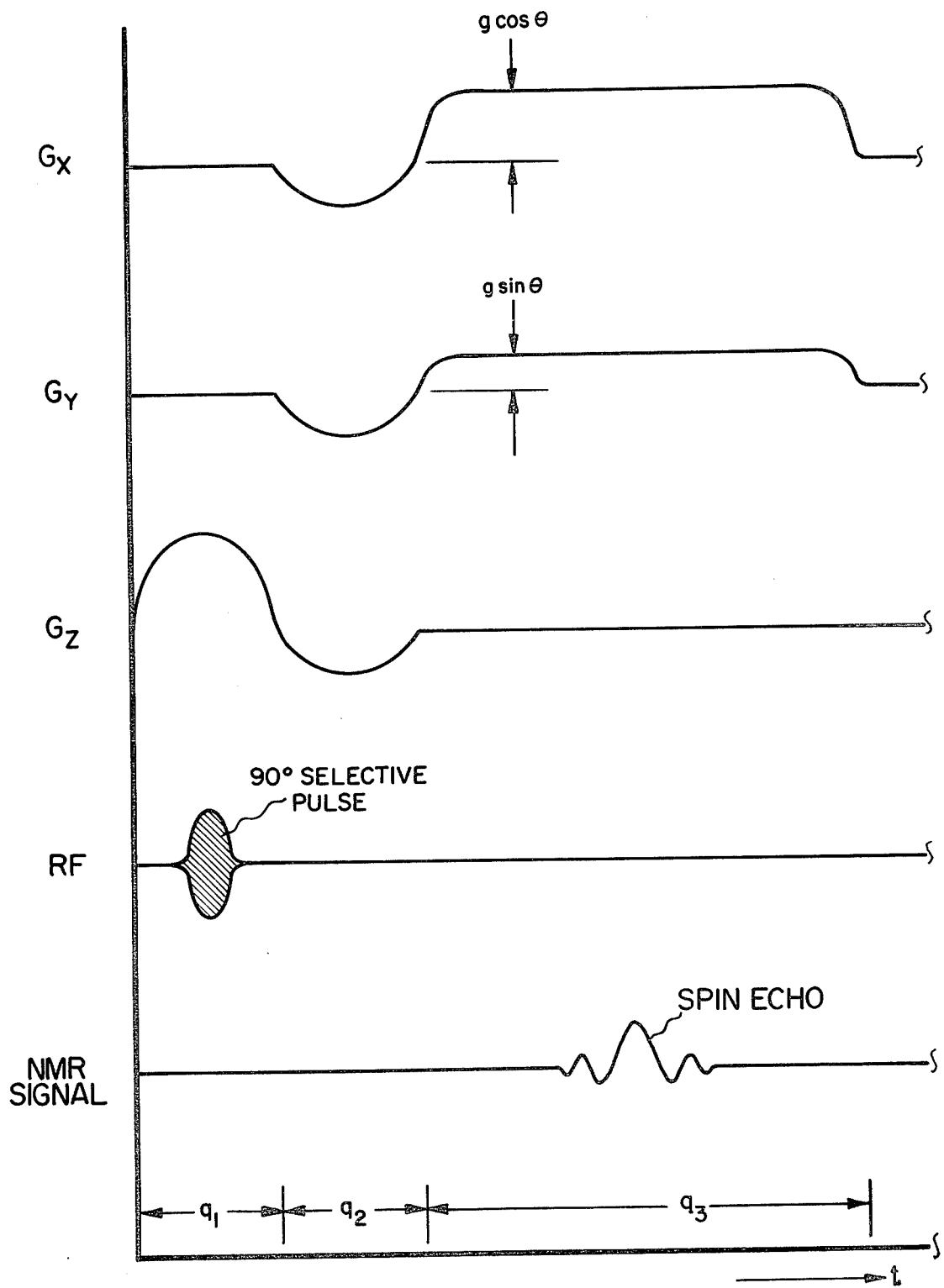
FIG. 3 illustrates an alternative conventional NMR pulse sequence used in multiple angle projection reconstruction in which a negative imaging gradient in the x direction is applied to produce a spin echo.

FIGS. 2, 3, and 4 illustrate NMR imaging pulse sequences for determining nuclear spin density in a planar volume and in comparison to which the advance of the present invention may be best appreciated. FIGS. 2 and 3 illustrate NMR pulse sequences used in multiple angle projection reconstruction, while FIG. 4 depicts a pulse sequence employed in spin warp imaging. Spin warp imaging is a specific example of the two-dimensional Fourier transform imaging method.

Figure 1:
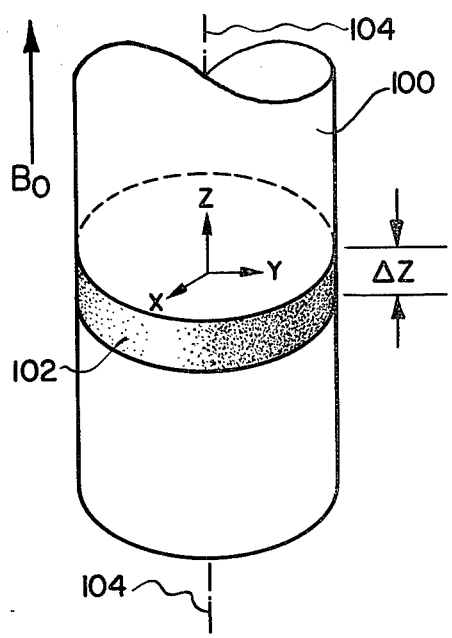
FIG. 1 illustrates an object situated in a static magnetic field and having a planar volume defined therein by selective excitation.

The multiple angle projection reconstruction imaging method, which will be best understood with reference to FIGS. 1 and 2, is a planar method and therefore requires that the data collecting process be localized to a thin planar slab (termed the imaging plane) in the object of interest. Selection of the thin planar slab is accomplished by a technique known as selective excitation. FIG. 1 depicts a sample 100 positioned in a static homogeneous magnetic field $B_o$ directed in the positive z-axis direction of a conventional Cartesian coordinate system. The z-axis is selected to be coincident with cylindrical axis 104 of the sample. The origin of the coordinate system is taken to be the center of the sample, which is also at the center of the thin planar slab or imaging volume $\Delta z$. Magnetic field $B_o$ is applied during the entire NMR experiment and accordingly is omitted from all of the figures depicting NMR pulse sequences.

To produce spatial localization of the NMR signal, it is necessary to apply gradient magnetic fields in addition to the main magnetic field $B_o$. Typically, three such gradients are necessary:

$$G_x(t) = \partial B_o / \partial x \tag{2}$$

$$G_y(t) = \partial B_o / \partial y \tag{3}$$

$$G_z(t) = \partial B_o / \partial z \tag{4}$$

The $G_x$, $G_y$, and $G_z$ gradients are constant throughout the imaging volume $\Delta z$, (FIG. 1), but their magnitudes are typically time dependent. The magnetic fields associated with the gradients are denoted, respectively, $b_x$, $b_y$, and $b_z$, wherein $$b_x = G_x(t)x \tag{5}$$

$$b_y = G_y(t)y \tag{6}$$

$$b_z = G_z(t)z \tag{7}$$

within the imaging volume. The RF magnetic field pulses are applied in the x-y plane; e.g., along the x-axis.

Selection of the planar volume of nuclear spins is accomplished during interval $q_1$ by the application of a magnetic field gradient $G_z$ as shown in FIG. 2. Thus, object 100 is subjected to a total magnetic field in the z axis direction composed of magnetic field gradient $G_z$ and static magnetic field $B_o$.

While object 100 is subjected to the magnetic field gradient $G_z$ during interval $q_1$, it is irradiated with a selective 90° RF pulse. The RF pulse contains a limited band of frequencies selected to excite nuclear spins only in the thin planar slab, $\Delta z$ (FIG. 1), of object 100 in which the magnetic field strength is as predicted by the Larmor equation. The Larmor equation predicts that the resonant frequency of the nuclear spin is dependent on the magnetic field strength to which the nuclear spins are exposed. Nuclear spins outside the thin planar slab $\Delta z$ remain substantially unaffected by the RF pulse. The "selective" nature of the 90° RF pulse is thus apparent.

At the end of interval $q_1$, nuclear spins in the thin planar slab $\Delta z$ have been reoriented (nutated) into the x-y plane. Although the nutated spins precess at the same frequency, they are out of phase with one another due to the dephasing effects of $G_z$ during the second half of interval $q_1$. The nuclear spins can be rephased by the application in interval $q_2$ of a negative $G_z$ gradient. The positive and negative $G_z$ gradients are selected such that:

$$\int_{q_2} dt\, G_z = -\tfrac{1}{2} \int_{q_1} dt\, G_z \tag{8}$$

in which $$\int_{q_1}$$

is the integral of the waveform of gradient $G_z$ over interval $q_1$ and $$\int_{q_2}$$

is the integral of the waveform of gradient $G_z$ over interval $q_2$.

The data are collected during interval $q_3$ by observing the FID signal in the presence of simultaneously applied varying magnetic field gradients $G_x$ and $G_y$ directed in the x- and y-axis directions, respectively. The magnitudes of the magnetic field gradients $G_x$ and $G_y$ vary in sinusoidal fashion in interval $q_3$ and may be described as:

$$G_x = g \cos \theta \tag{9}$$

$$G_y = g \sin \theta \tag{10}$$

in which $\theta$ is the angle of a single projection during interval $q_3$ and g is a constant. The FID is thus observed in the presence of a magnetic field gradient which is the sum of $G_x$ and $G_y$ gradient fields. The $G_x$ and $G_y$ field gradients add vectorially to produce a resultant radial gradient in the imaging plane at angle $\theta$. Spatial information from the entire plane is encoded in the direction of the radial gradient. In order to obtain sufficient information to image the entire plane, multiple projections are obtained by changing projection angle $\theta$ at, for example, 1° intervals to collect spatial data from 180 projections in a 180° arc. Fourier transformation of the signal corresponding to each projection provides the spatial distribution of the NMR signal in that direction. The image is reconstructed from all of the projections using a known computer reconstruction algorithm.

In accordance with the technique of multiple angle projection reconstruction, the FID signal is read out in the presence of gradients so as to obtain useful information of spatial spin distribution. In order to do this, information must be gathered immediately at the end of the negative rephasing $G_z$ pulse in interval $q_2$. However, application of the read-out $G_x$ and $G_y$ gradient magnetic fields is a problem. Even if the read-out gradient magnetic fields are applied abruptly, there will be a finite time period when the exact resulting gradient is transient and does not satisfy equations (9) and (10). Thus, during this period spatial information is badly distorted and the NMR signal cannot be normally be used. A known way to overcome this problem is to apply the $G_x$ and $G_y$ magnetic field gradients, as shown in FIG. 2, and sample at unequal time intervals $\Delta t$. The time intervals $\Delta t$ are chosen so that at any time $t_i$ during interval $q_2$, the product $\Delta t_i \cdot G(t_i)$ is constant.

An alternative to sampling at different rates is to apply negative $G_x$ and $G_y$ gradients during period $q_2$, as shown in FIG. 3, to delay the FID signal and to obtain a form of spin echo. The effect of the negative $G_x$ and $G_y$ gradients is to dephase the spins. The positive $G_x$ and $G_y$ gradients reverse the direction of the spin dephasing, so that the spins again rephase and produce an echo signal which can be observed in the period that the resulting radial gradient is constant. However, the deleterious dephasing effect due to inherent inhomogeneities in the $B_o$ field is not reversed in this scheme. This represents a loss in spatial spin distribution information and signal intensity. This problem is overcome by the present invention.

It is advantageous to consider a second NMR pulse imaging sequence, known as spin-warp imaging, in order to further illustrate the advantages of the present invention. Reference is now made to FIG. 4 which illustrates the spin-warp NMR pulse sequence. A thin planar slab of spins, orthogonal to the z-axis, is selected by the selective excitation technique as described previously and the spins reoriented by 90° as described. Following the 90° RF pulse, a negative $G_z$ gradient is applied to rephase the spins. During time interval $q_2$, a negative $G_x$ gradient magnetic field can also be applied to delay the occurrence of the NMR signal.

A phase encoding programmable amplitude gradient $G_y$ in the Y-axis direction is used during interval $q_2$ to encode phase information by introducing a twist in the spins in the Y-axis direction by a multiple of 2. FIG. 1 illustrates the selected thin planar slab $\Delta z$ orthogonal to the z-axis. FIG. 5a shows the profile of spins before the application of the phase encoding gradient $G_y$. Following the application of the first $G_y$ gradient, the spins are twisted into a one-turn helix as shown in FIG. 5b. The spatial information encoded by the different phases of the spins is read out by the application during interval $q_3$ (FIG. 4) of a $G_x$ gradient which causes spins at different x positions to precess at different frequencies, enabling the separation of signals in each x position. This is essentially a projection of the information onto the x-axis. The entire pulse sequence is repeated for different values of $G_y$ which twist the spins into different multi-turned helices. Each projection contains different information because of the different $G_y$ phase encoding gradients used. This is shown in FIG. 4 by the dashed lines indicating sequential application of different $G_y$ encoding gradients. The complete planar image is reconstructed by a two-dimensional Fourier transformation of the projections.

As in the aforedescribed multiple angle projection reconstruction imaging method, the negative lobe of the $G_x$ gradient does not reverse the dephasing of nuclear spins due to the inherent magnetic field inhomogeneity, resulting in a loss in NMR signal intensity.

Figure 6:
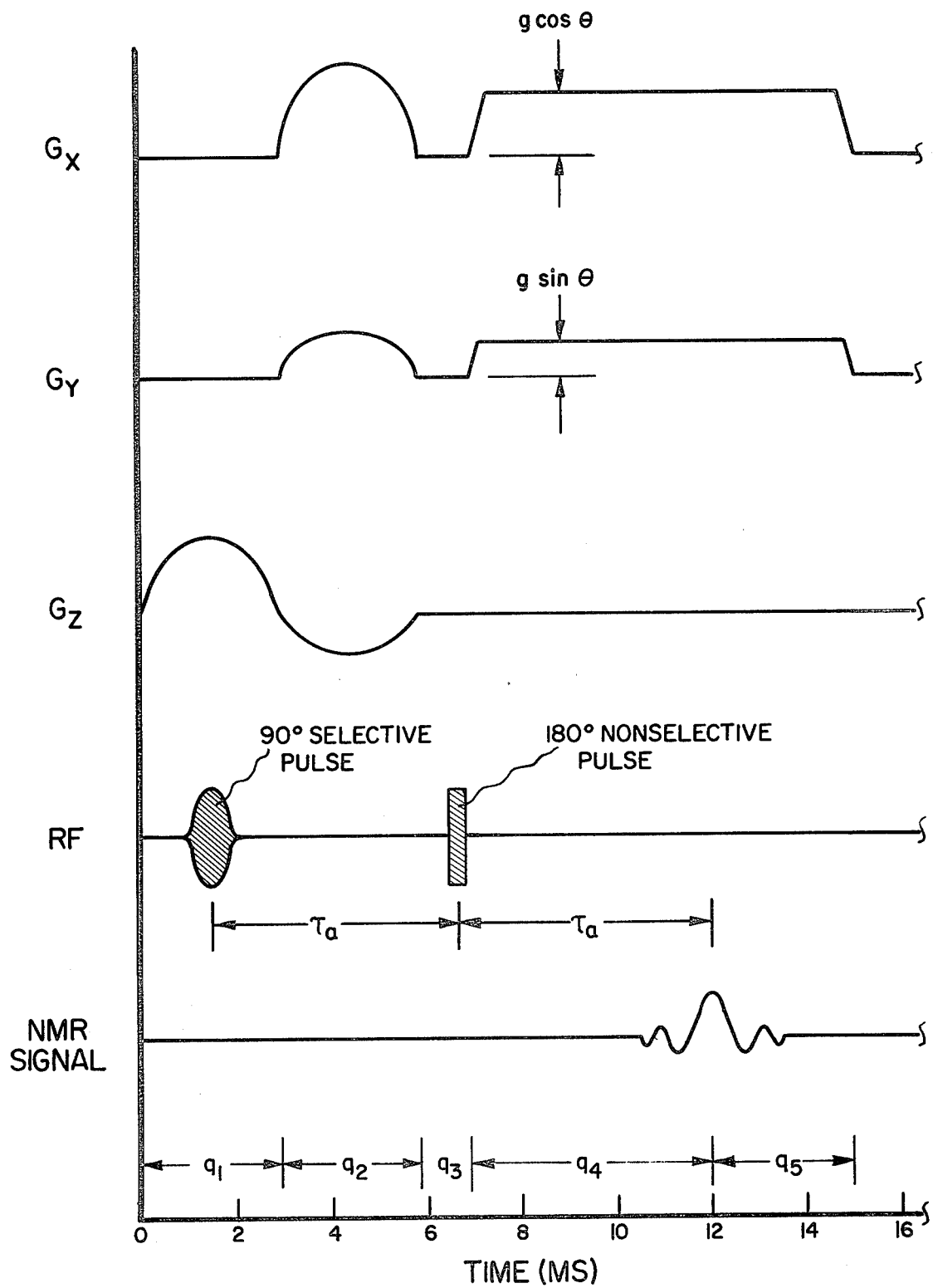
FIG. 6 illustrates the NMR pulse sequence of the invention as used in multiple angle projection reconstruction imaging.

The pulse sequence of the invention for NMR imaging by multiple angle projection reconstruction will now be described with reference to FIG. 6. A thin planar slab of spins perpendicular to the z-axis is defined by the selective excitation method previously described. Briefly, a narrow frequency band 90° RF pulse is applied during period $q_1$ in the presence of a positive gradient $G_z$. The RF pulse could, for example, be in the form of a Gaussian amplitude modulated RF carrier as shown in FIG. 6, in which case the thin planar region $\Delta z$ (of FIG. 1) would have a Gaussian profile. The RF pulse could also take the form of a carrier modulated by (sin bt)/bt, in which t is time and b is a constant. In the latter case the thickness profile of the selected plane section would be approximately rectangular. In interval $q_2$, a negative $G_z$ lobe is applied to rephase the spins excited in interval $q_1$. The negative $G_z$ gradient pulse is identical to that used in the aforedescribed multiple angle projection reconstruction.

In interval $q_2$ dephasing gradients $G_x$ and $G_y$ are applied in the x- and y-coordinate directions, respectively. The application of $G_x$ and $G_y$ gradients in period $q_2$, is followed by a short waiting period of typically between about 0.1 and 1 milliseconds to allow the currents in the gradient windings to subside. Following the waiting period, a 180° nonselective inverting RF pulse is applied to the sample during interval $q_3$. During interval $q_4$, the NMR signal is read out in the presence of rephasing $G_x$ and $G_y$ gradients, the amplitudes of which vary according to $\cos \theta$ and $\sin \theta$, respectively. An example of duration (in milliseconds) of the various pulses in the NMR pulse sequence is shown along the horizontal axis in FIG. 6. The NMR pulse sequence shown in FIG. 6 is repeated (at 1° intervals, for example) for new values of $\theta$ to cover at least a 180° arc in the imaging plane, where $\theta$ is the angle of the particular projection, as described before.

The detailed sequence is as follows: following the selective spin excitation and spin rephasing using a negative $G_z$ lobe, the spins are nutated 90° from the z-axis. Due to inherent inhomogeneities in static field $B_o$, the spins begin to dephase by the $T_2^*$ process, although they precess at the same frequency. The 180° RF pulse will reverse the dephasing process so that a spin echo due to the inherent inhomogeneity of $B_o$ will occur at the end of a time interval $\tau_a$ (typically 5 milliseconds) following the irradiation with the 180° RF pulse. The interval $\tau_a$ is the time between the mean application of the 90° RF pulse and the mean application of the 180° RF pulse as shown in FIG. 6. The 180° RF pulse will also induce a spin echo to occur from the dephasing and rephasing of the spins produced by a gradient which is the resultant of the vectorial addition of the $G_x$ and $G_y$ gradients. The time of occurrence of the echo due to the resultant gradient is dependent on the degree of the initial dephasing. Thus, in order to obtain the optimum spin echo signal, it is necessary to adjust the magnitude of the $G_x$ and $G_y$ gradient dephasing pulses applied during interval $q_2$ such that the echo caused by the resultant rephasing gradient in interval $q_4$ also occurs after the interval of time $\tau_a$ following the application of the 180° RF pulse. The use of the 180° RF pulse in combination with the rephasing gradients results in coincident rephasing of the spin echo from the applied gradients and the rephasing of the spin echo from the inhomogeneities in the applied field $B_o$ to produce a composite NMR signal.

In order for the two spin echoes to coincide, the integrals of the $G_x$ and $G_y$ gradient waveforms in intervals $q_2$ and $q_4$ must satisfy the respective conditions that $$\int_{q_2} G_x dt = \int_{q_4} G_x dt \qquad (11)$$

and $$\int_{q_2} G_y dt = \int_{q_4} G_y dt. \qquad (12)$$

Although magnetic field gradients $G_x$ and $G_y$ are depicted in interval $q_2$ as positive halves of a sinusoid, they can be of any shape, provided equations (11) and (12) are satisfied. For example, gradients $G_x$ and $G_y$ could have either a Gaussian or rectangular configuration.

Figure 7:
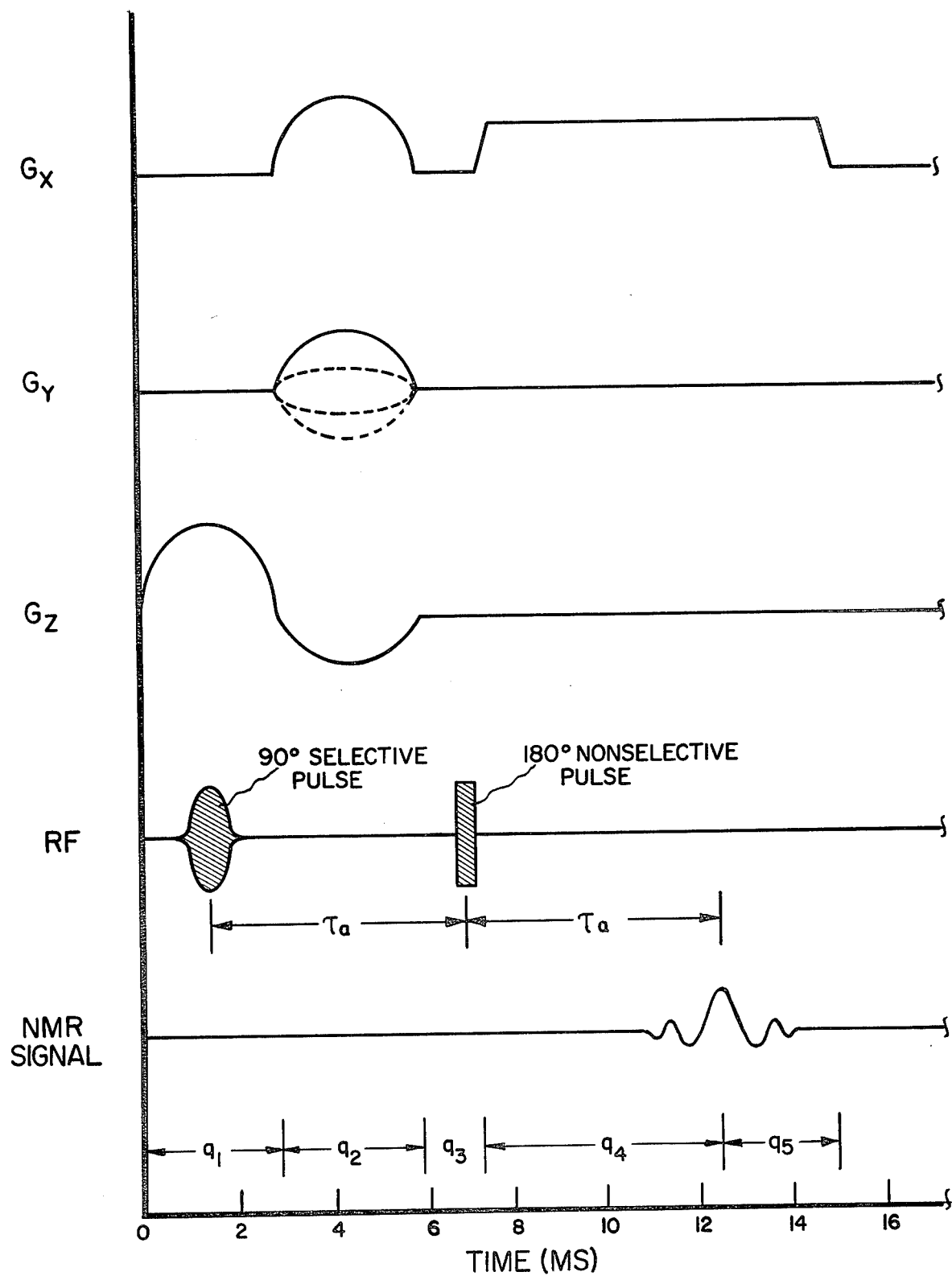
FIG. 7 illustrates the NMR pulse sequence of the invention as used in the spin warp imaging method.

FIG. 7 illustrates NMR pulse sequences in accordance with the present invention, as used in spin-warp imaging. During interval $q_1$, a positive $G_z$ gradient and a selective 90° RF pulse having a Gaussian or (sin bt)/bt profile are used to excite nuclear spins in a thin planar slab, such as slab Δz in FIG. 1. In interval q2, a negative $G_z$ gradient, related to the positive $G_z$ gradient in the manner stated in equation (8), is applied to rephase the nuclear spins in planar region Δz which were excited in interval q1.

In the manner previously described with respect to the spin-warp imaging pulse sequence (FIG. 4 and FIGS. 5a–5b), a phase encoding $G_y$ gradient is applied during interval q2 to enable spatial information in the y direction to be obtained. In accordance with the pulse sequence of the invention, however, a positive $G_x$ gradient is also applied during interval q2 to dephase nuclear spins so that a spin echo will occur at the end of a time interval equal to $2\tau_a$ following the mean application of the selective 90° RF pulse and not at the end of interval q2.

In interval q3, following a short period of time of between 0.1 and 1 millisecond to allow the currents in the gradient windings to die down, a 180° nonselective inverting RF pulse is applied to the sample. During intervals q4 and q5 a positive rephasing $G_x$ gradient is applied to obtain the spatial nuclear spin information along the x-axis. The pulse sequence shown in FIG. 7 is repeated for n, (n is the number of lines in the image, and typically is 128 or 256) different values of gradient $G_y$, as indicated by the dashed lines in interval q2, to obtain additional information in the y-axis direction. A typical timing sequence is indicated on the horizontal time axis.

The nuclear spin echo due to the inherent inhomogeneities in the static magnetic field $B_o$ occurs at a time $\tau_a$ after the mean application of the 180° RF pulse. Time $\tau_a$ is equal to the time between 90° and 180° RF pulses. The echo due to the $G_x$ rephasing pulse in intervals q4 and q5 also occurs at a time $\tau_a$ after the 180° RF pulse. It is therefore necessary that $$\int_{q2} G_x dt = \int_{q4} G_x dt \qquad (13)$$

in which $$\int_{q2}$$

is the integral of the waveform of gradient $G_x$ over interval q2 and $$\int_{q4}$$

is the integral of the waveform of gradient $G_x$ over interval q4. In this manner, a composite nuclear spin echo signal is produced by the coincidence of the nuclear spin echo from the applied gradients and the nuclear spin echo derived from rephasing of nuclear spins in the presence of the inhomogeneities inherent in static magnetic field $B_o$.

The 180° RF pulse in the respective intervals q3 of FIG. 6 and FIG. 7 used to rephase the nuclear spins and to generate a nuclear spin echo is applied when the gradients ($G_x$ and $G_y$) are turned off. This permits the use of long RF pulse lengths, thus reducing RF power requirements. In contrast, if the RF pulse is applied with the imaging gradients turned on (as is done in some conventional NMR pulse sequences) it must be extremely short in order to irradiate the entire range of NMR frequencies generated in the sample by the gradients. This in turn leads to excessive pulsed RF power requirements (e.g., on the order of 5 kilowatts).

The pulse sequences of the invention may be used to obtain $T_1$ and $T_2$ relaxation time information.

In accordance with a first method for obtaining $T_1$ information, the pulse sequences illustrated in FIGS. 6 and 7 are repeated for each direction of the resultant dephasing and rephasing gradients (i.e., for each θ) or each amplitude of the phase encoding gradient (i.e., for each n) at a repetition period T selected such that T is of the order of $T_1$ of the sample. Repetition period T may be thus between about 0.03 and about 3 seconds, but preferably is between about 0.1 and about 1.0 second. This provides for attenuation or saturation of those $T_1$ components of the sample with longer $T_1$ relaxation times relative to the shorter components. The image produced by observing the NMR signal reflects the nuclear spin density and spatial distribution of $T_1$ values as within the sample.

Figure 8:
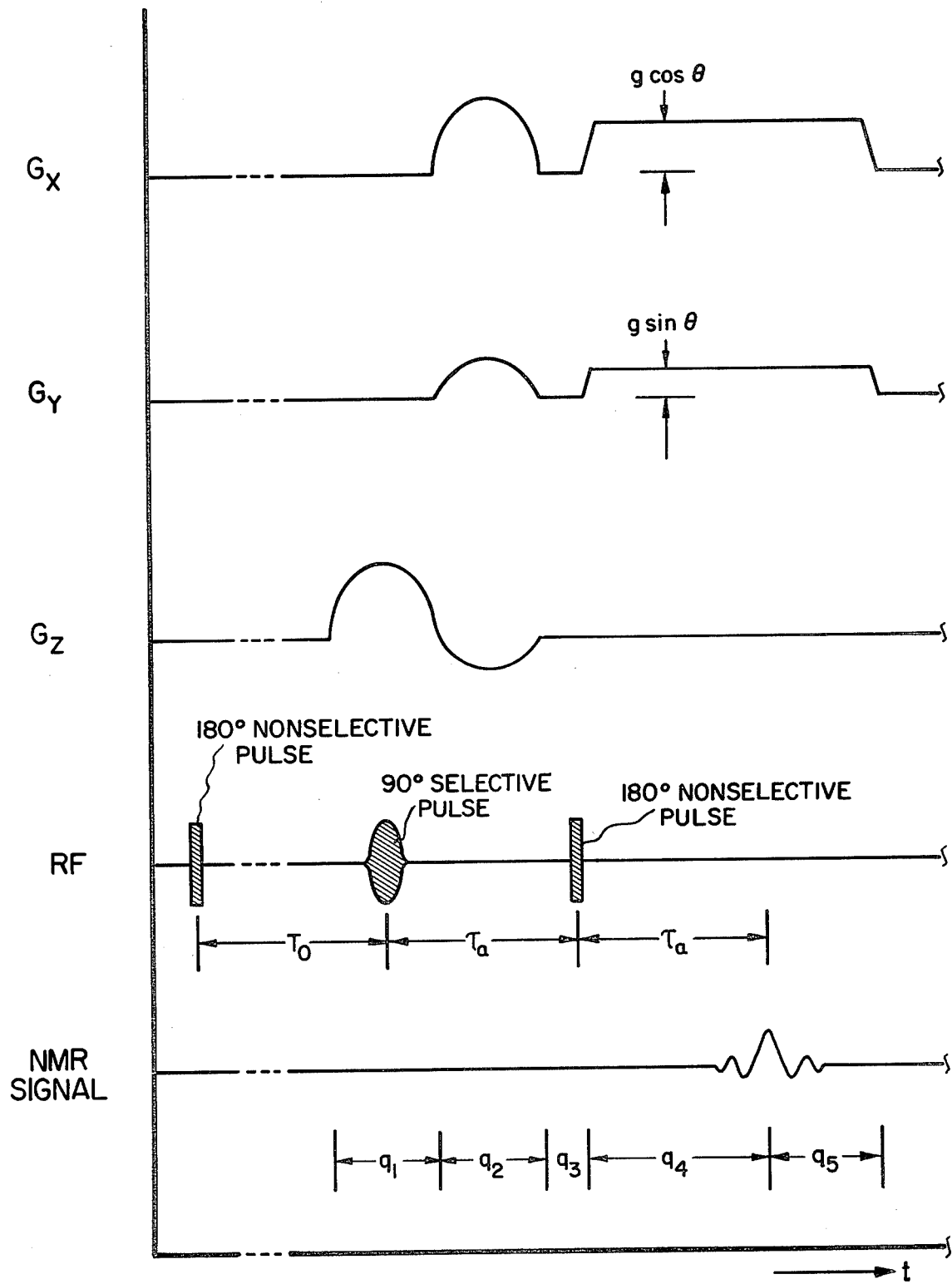
FIG. 8 depicts an NMR pulse sequence employed in the invention for obtaining information about the spatial distribution of $T_1$ relaxation time in conjunction with the pulse sequence depicted in FIG. 6.
Figure 9:
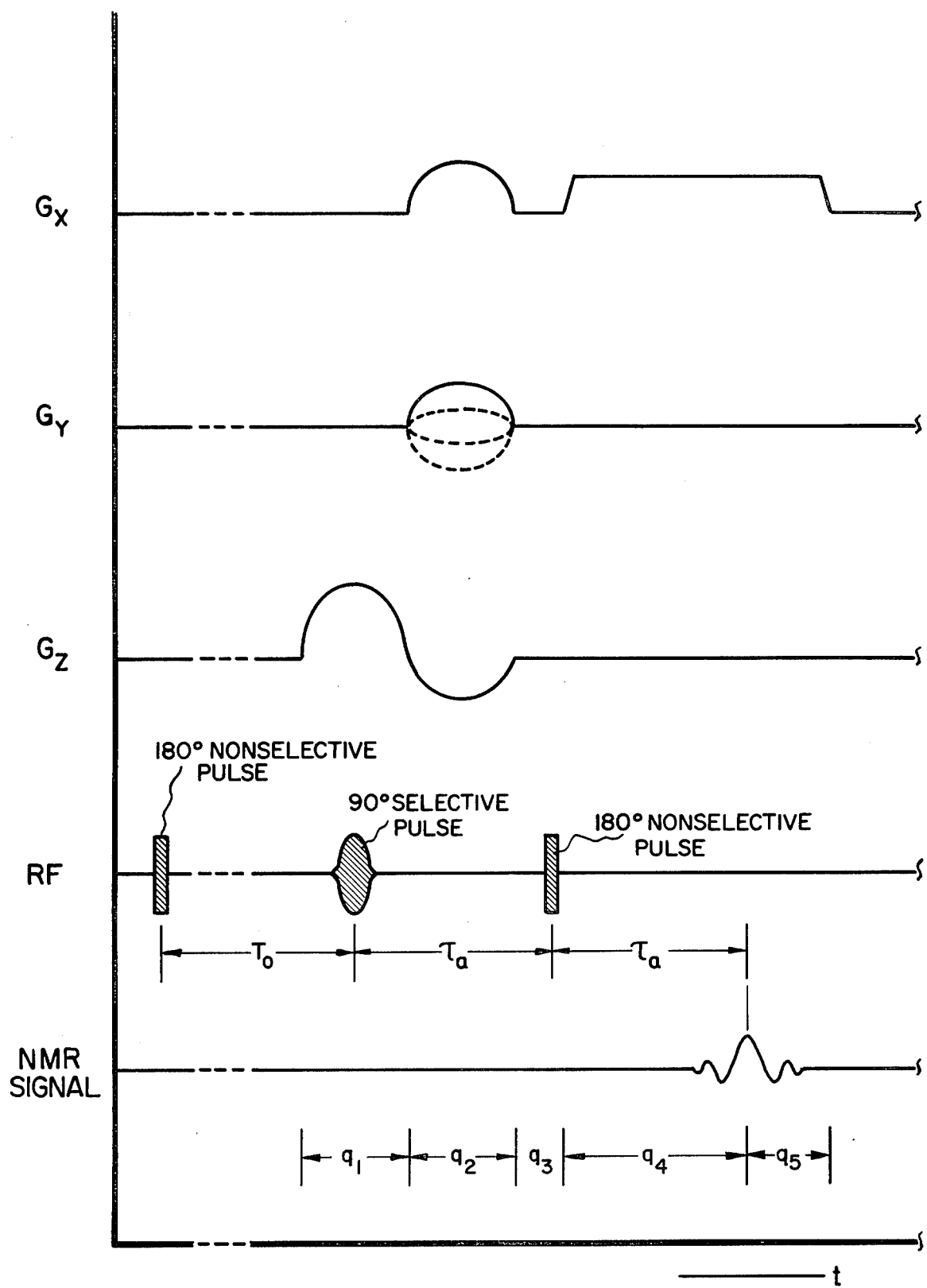
FIG. 9 depicts an NMR pulse sequence employed in the invention for obtaining information about the spatial distribution of $T_1$ relaxation time in conjunction with the pulse sequence depicted in FIG. 7.

A second technique for obtaining $T_1$ information is illustrated in FIGS. 8 and 9 for multiple angle projection and spin-warp imaging, respectively. In accordance with this technique, prior to the commencement of each NMR pulse sequence of the invention, the sample is irradiated with a nonselective 180° RF pulse at a mean time $T_0$ prior to the mean selective 90° RF pulse. Alternatively, the 180° RF pulse may be an adiabatic fast passage. The time $T_0$ is selected to be approximately of the order of $T_1$ for the sample. For example, $T_0$ may range between 0.03 and 3 seconds, with 0.3 second being typical for imaging the human body. The 180° RF pulse produces inversion of the nuclear magnetic moments according to their $T_1$ values. The resulting image is an image which reflects the spatial distribution of nuclear spin density and $T_1$ values within the sample.

It is also possible to combine the first and second techniques described above to produce an NMR image reflecting the spatial distribution of $T_1$ values alone within the sample. In accordance with this technique, the pulse sequences illustrated in FIGS. 8 and 9 are repeated for each direction of the dephasing and rephasing gradients and magnitude of the phase encoding gradient, respectively, at a repetition period of between about 0.03 and about 3 seconds or preferably between about 0.1 and about 1 second.

$T_2$ relaxation time may be obtained by adjusting time $\tau_a$ (FIGS. 6 and 7) such that $\tau_a$ is of the order of $T_2$ of the sample. Time $\tau_a$ may be adjusted between 2 and 1500 milliseconds with a typical value being 30 milliseconds. This provides for the attenuation of the nuclear spin echo according to $T_2$ relaxation time in the sample, thus providing a $T_2$ image. Each of the abovedescribed techniques used for obtaining $T_1$ information may be combined with this technique for obtaining $T_2$ information. Thus, in FIGS. 8 and 9, times $T_0$ and $\tau_a$, as well as the repetition period between each pulse sequence for each value of θ or n may be varied within the limits set forth above. The resulting pulse sequences are suitable for obtaining combined $T_1$ and $T_2$ imaging information simultaneously.

Figure 10:
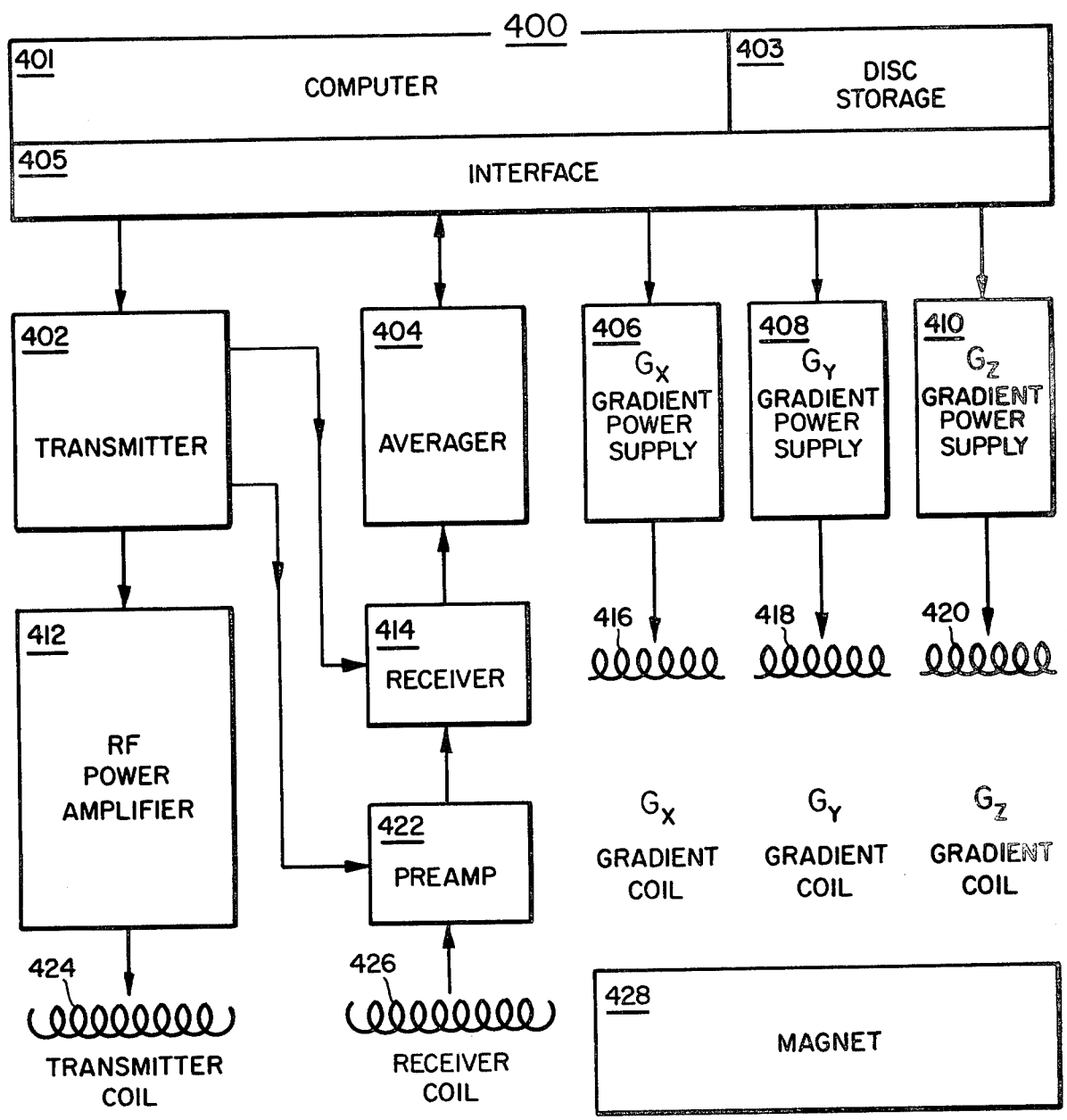
FIG. 10 illustrates a simplified block diagram of the major components of an NMR imaging apparatus suitable for use with the NMR pulse sequences employed with the invention.

FIG. 10 is a simplified block diagram of the major components of an NMR imaging system suitable for use with the NMR pulse sequences of the invention described herein. The system, generally designated 400, is made up of a general purpose minicomputer 401 which is functionally coupled to disk storage unit 403 and an interface unit 405. An RF transmitter 402, signal averager 404, and gradient power supplies 406, 408, and 410 for energizing, respectively, x, y, z gradient coils 416, 418, and 420, are coupled to computer 401 through interface unit 405.

RF transmitter 402 is gated with pulse envelopes from computer 401 to generate RF pulses having the required modulation to excite resonance in the object under study. The RF pulses are amplified in RF power amplifier 412 to levels varying from 100 watts to several kilowatts, depending on the imaging method, and applied to transmitter coil 424. The higher power levels are necessary for large sample volumes such as in whole body imaging, and where short duration pulses are required to excite large NMR frequency bandwidths.

The NMR signal is sensed by receiver coil 426, amplified in a low noise preamplifier 422, and applied for further amplification, detection, and filtering to receiver 414. The signal is then digitized for averaging by signal averager 404 and for processing by computer 401. Preamplifier 422 and receiver 414 are protected from the RF pulses during transmission by active gating or by passive filtering.

Computer 401 provides gating and envelope modulation for the NMR pulses, blanking for the preamplifier and RF power amplifier, and voltage waveforms for the gradient power supplies. The computer also performs data processing such as Fourier transforms, image reconstruction, data filtering, imaging display, and storage functions (all of which are beyond the scope of the present invention).

Figure 11A:
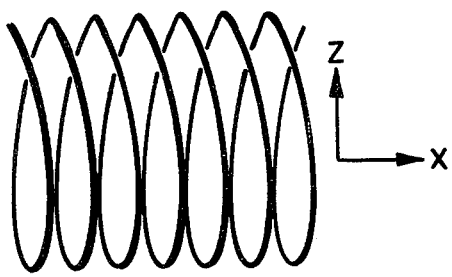
FIG. 11a illustrates an RF coil design for use with geometries for which the sample chamber is perpendicular to the static magnetic field.
Figure 11B:
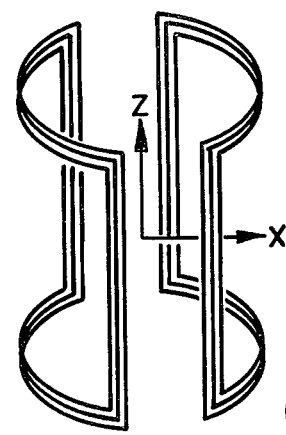
FIGS. 11b and 11c illustrate an RF coil design suitable for magnetic geometries for which the axis of the sample diameter is parallel to the static magnetic field.
Figure 11C:
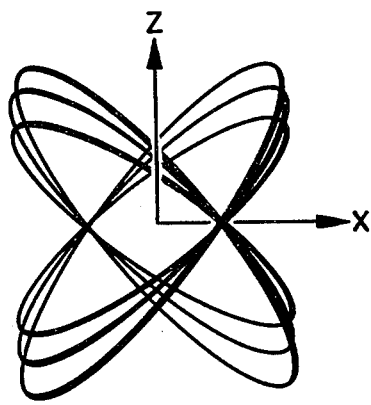

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of the static magnetic field $B_o$ produced by magnet 428 (FIG. 10). The coils are isolated from the remainder of the system by enclosure in an RF shielded cage. Three typical RF coil designs are illustrated in FIGS. 11a, 11b, and 11c. All of these coils produce RF magnetic fields in the x direction. The coil designs illustrated in FIGS. 11b and 11c are suitable for magnetic geometries for which the axis of the sample chamber is parallel to the main field $B_o$ (FIG. 1). The design illustrated in FIG. 11a is applicable to geometries for which the sample chamber axis is perpendicular to the main field $B_o$ (not shown).

Figure 12A:
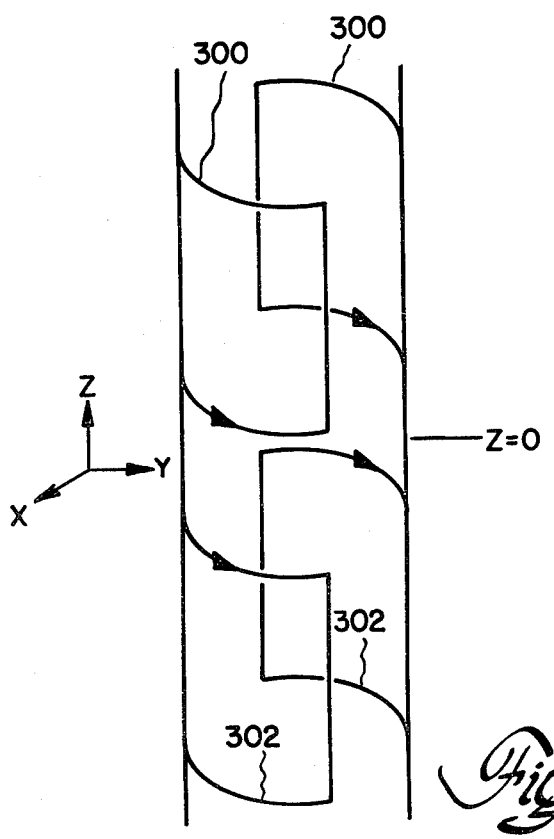
FIG. 12a illustrates two sets of coils suitable for producing $G_x$ and $G_y$ gradients.
Figure 12B:
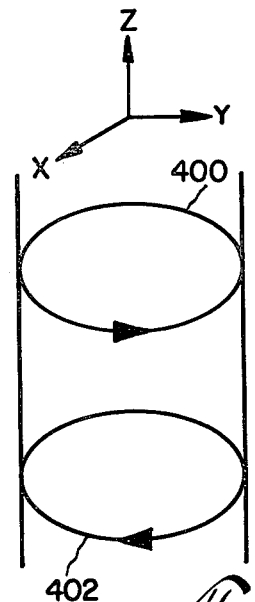
FIG. 12b depicts a coil configuration suitable for producing a $G_z$ gradient.

Magnetic field gradient coils 416, 418, and 420 (FIG. 10) are necessary to provide gradients $G_x$, $G_y$, and $G_z$, respectively. In multiple angle projection reconstruction and spin-warp methods described above, the gradients should be monotonic and linear over the sample volume. Multi-valued gradient fields cause a degradation in the NMR signal data, known as aliasing, which leads to severe image artifacts. Nonlinear gradients cause geometric distortions of the image. A design for gradient coils suitable for magnet geometries with a sample chamber axis parallel to the main field $B_o$ is depicted in FIGS. 12a and 12b. Each of gradients $G_x$ and $G_y$ is produced by a set of coils such as sets 300 and 302 depicted in FIG. 12a. The coil sets as illustrated in FIG. 12a produce gradient $G_x$. The coil sets for producing gradient $G_y$ are rotated 90° around the cylindrical axis 104 (FIG. 1) of the sample chamber relative to the coil that produces gradient $G_x$. The z gradient is generated by a coil pair such as coils 400 and 402 shown in FIG. 12b.

From the foregoing, it will be apparent that the NMR pulse sequences in accordance with the present invention overcome the effects of inherent static magnetic field inhomogeneity on spin echo formation. The MNR pulse sequence is used in planar imaging methods such as spin warp and multiple angle projection reconstruction. The NMR pulse sequences of the invention may also be used to obtain spatial distribution information of the $T_1$ and $T_2$ relaxation times. The use of pulsed magnetic field gradients allows a reduction in RF power requirements for the echoproducing RF pulse.

While this invention has been and described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for NMR image formation which overcomes the effects of inherent static magnetic field inhomogeneity on nuclear spin echo formation, said method comprising the steps of:
   a. maintaining a static magnetic field along a first axis of a sample;
   b. irradiating said sample with a frequency selective RF pulse so as to excite a plurality of nuclear spins in a predetermined region within said sample;
   c. applying, for a first predetermined time interval, at least partially coextensive with said frequency selective RF pulse, at least one dephasing magnetic field gradient along a second axis of said sample to dephase said excited nuclear spins, said dephasing being in addition to nuclear spin dephasing induced by inherent inhomogeneities in said static magnetic field;
   d. irradiating said sample during a second predetermined time at a predetermined elapse time interval $\tau_a$ subsequent to the mean occurrence of said frequency selective RF pulse, with a 180° RF pulse so as to initiate the rephasing of said excited nuclear spins;
   e. applying, during a third predetermined time interval, subsequent to said second time interval, at least one rephasing gradient having the same direction as said dephasing gradient such that, at an interval of time equal to said interval $\tau_a$ following said 180° RF pulse, the nuclear spin echo caused by rephasing of the nuclear spins dephased by said dephasing gradient coincides with the occurrence of the nuclear spin echo derived from the rephasing of the nuclear spins dephased by the inherent inhomogeneities in said static magnetic field, said nuclear spin echoes producing a composite NMR signal; and
   f. detecting said composite NMR signal.

2. The method of claim 1 wherein said frequency selective RF pulse comprises a Gaussian amplitude-modulated carrier.

3. The method of claim 1 wherein said frequency selective RF pulse comprises a carrier modulated by (sin bt)/bt, wherein b is a constant and t is time.

4. The method of one of claims 1, 2, or 3 wherein said selective RF pulses comprises a selective 90° RF pulse.

5. The method of claim 4 wherein said dephasing magnetic field gradient comprises a rectangularly shaped time dependent pulse.

6. The method of claim 4 wherein said dephasing magnetic field gradient comprises one-half of a sinusoid.

7. The method of claim 4 wherein said dephasing magnetic field gradient comprises a Gaussian shaped time dependent pulse.

8. The method of claim 1, wherein said predetermined region of excited nuclear spins comprises a thin planar slab.

9. The method of claim 8 wherein said thin planar slab is situated orthogonal to said first axis of said sample.

10. The method of claim 8 or 9 wherein said dephasing gradient is a resultant dephasing gradient of the vectorial addition of two constituent dephasing gradients with are mutally orthogonal and which are coplanar with said thin planar slab, said resultant dephasing gradient having a predetermined direction.

11. The method of claim 10 wherein said rephasing gradient is a resultant rephasing gradient of the vectorial addition of two constituent rephasing gradients which are mutually orthogonal and which are coplanar with said thin planar slab, said constituent rephasing gradients having the same respective directions within said thin planar slab as said constituent dephasing gradients, said constituent rephasing gradients being selected such that said resultant rephasing gradient has the same predetermined direction as said resultant dephasing gradient.

12. The method of claim 11 wherein the integral of the waveform of said resultant dephasing gradient with respect to time over said first time interval is selected to be equal to the integral of the waveform of said resultant rephasing gradient with respect to time over a time interval equal to said time interval $\tau_a$.

13. The method of claim 12 wherein said resultant rephasing gradient is selected to exhibit a constant amplitude during the step of detecting said composite NMR signal.

14. The method of claim 13 further comprising the step of repeating the sequence of steps a–f for different directions of said resultant dephasing and rephasing gradients so as to cover, incrementally, at least a 180° arc within said thin planar slab.

15. The method of claim 14 further comprising the steps of repeating for each direction of said resultant dephasing and rephasing gradients the sequence of steps a–f at a repetition period of between 0.03 and 3 seconds.

16. The method of claim 15 wherein said repetition period is selected to be between about 0.1 and about 1 second.

17. The method of claim 14 further comprising the step of irradiating said sample with a 180° RF pulse at about 0.03 and about 3 seconds priod to step b.

18. The method of claim 17 further comprising the step of repeating the sequence of steps a–f, including irradiating said sample with said 180° RF pulse prior to step b, for each direction of said resultant dephasing and rephasing gradients at a repetition period of between about 0.03 and 3 seconds.

19. The method of claim 14 wherein said predetermined time interval $\tau_a$ between said frequency selective RF pulse in step b and said 180° RF pulse in step d is selected from a range of between about 2 and about 1500 milliseconds.

20. The method of claim 19 further comprising the step of repeating said sequence of steps a–f, including said step of selecting said time interval $\tau_a$, for each direction of said resultant dephasing and rephasing gradients at a repetition period of between about 0.03 and about 3 seconds.

21. The method of claim 19 further comprising the step of irradiating said sample with a 180° RF pulse at a time of between about 0.03 and about 3 seconds prior to step b.

22. The method of claim 21 further comprising the step of repeating the sequence of steps a–f, including said step of irradiating said sample with a 180° RF pulse prior to step b, for each direction of said resultant dephasing and rephasing gradients at a repetition period of between 0.03 and 3 seconds.

23. The method of claim 8 or 9 wherein said dephasing gradient is the resultant of the vectorial addition of first and second mutually orthogonal gradients which are coplanar with said thin planar slab, said first gradient being amplitude-adjustable for phase encoding nuclear spin information in the direction thereof.

24. The method of claim 23 wherin said rephasing gradient has the same direction as said second gradient.

25. The method of claim 24 wherein the integral of the waveform of said second gradient with respect to time over said first time interval is selected to be equal to the integral of the waveform of said rephasing gradient with respect to time over a time interval equal to said time interval $\tau_a$.

26. The method of claim 25 wherein said rephasing gradient is selected to have a constant amplitude during the step of detecting said composite NMR signal.

27. The method of claim 26 further comprising the step of repeating the sequence of steps a–f for a different amplitude of said first gradient.

28. The method of claim 27 further comprising the step of repeating the sequence of steps a–f for each amplitude of said first gradient at a repetition period of between about 0.3 and about 3 seconds.

29. The method of claim 28 wherein said repetition period is selected to be between about 0.1 and about 1 second.

30. The method of claim 27 further comprising the step of irradiating said sample with a 180° RF pulse at a time of between about 0.03 and about 3 seconds prior to step b.

31. The method of claim 30 further comprising the step of repeating the sequence of steps a–f, including irradiating said sample with said 180° RF pulse prior to step b, for each amplitude of said first gradient at a repetition period of between about 0.03 and about 3 seconds.

32. The method of claim 27 wherein said predetermined time interval $\tau_a$ between said frequency selective RF pulse in step b and said 180° RF pulse in step d is selected from a range of between about 2 and about 1500 milliseconds.

33. The method of claim 32 further comprising the step of repeating said sequence of steps a–f, including said step of selecting said time interval $\tau_a$, for each amplitude of said first gradient at a repetition period of between about 0.03 and about 3 seconds.

34. The method of claim 32 further comprising the step of irradiating said sample with a 180° RF pulse at a time of between about 0.03 and about 3 seconds prior to step b.

35. The method of claim 34 further comprising the step of repeating the sequence of steps a–f, including said step of irradiating said sample with a 180° RF pulse prior to step b for each amplitude of said first gradient at a repetition period of between 0.03 and 3 seconds.

* * * * *